(12) United States Patent
Segawa (10) Patent No.: US 6,593,198 B2
(45) Date of Patent: Jul. 15, 2003

(54) SEMICONDUCTOR DEVICE AND METHOD FOR FABRICATING THE SAME

(75) Inventor: Mizuki Segawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/954,219

(22) Filed: Sep. 18, 2001

(65) Prior Publication Data

US 2002/0037612 A1 Mar. 28, 2002

(30) Foreign Application Priority Data

Sep. 18, 2000 (JP) ........................................ 2000-281856

(51) Int. Cl.⁷ .............................................. H01L 21/336
(52) U.S. Cl. ........................................ 438/303; 438/366
(58) Field of Search ................................. 438/229, 303, 438/305, 592, 652, 683, 653, 366

(56) References Cited

U.S. PATENT DOCUMENTS 6,417,056 B1 * 7/2002 Quek et al.
6,429,083 B1 * 8/2002 Ishida et al.
6,432,805 B1 * 8/2002 Paton et al.

FOREIGN PATENT DOCUMENTS

JP 11-345963 A 12/1999

* cited by examiner

*Primary Examiner*—Phuc T. Dang
(74) *Attorney, Agent, or Firm*—Nixon Peabody LLP; Donald R. Studebaker (57) ABSTRACT

Gate insulating film, gate electrode made up of lower and upper gate electrodes, and on-gate passivation film are formed in this order on an Si substrate. Then, a sidewall is formed as a stack of an oxynitride sidewall having an L-shaped cross section and a nitride sidewall, so as to surround the gate electrode and on-gate passivation film. Alternatively, only the lower edge of an L-oxide sidewall may be changed into an oxynitride region. Or an oxide or stacked sidewall and a nitride sidewall, covering the oxide or stacked sidewall, may be formed instead of the oxynitride sidewall. In any of these embodiments, the lower edge of the sidewall is not removed during a wet etching process.

14 Claims, 6 Drawing Sheets

SEMICONDUCTOR DEVICE AND METHOD FOR FABRICATING THE SAME

BACKGROUND OF THE INVENTION

The present invention relates to a semiconductor device including a silicide layer in its source/drain regions and also relates to a method for fabricating the device. The present invention more particularly relates to measures to reduce a junction leakage current.

Recently, as MISFETSs included in an LSI chip have their sizes tremendously reduced and their operating speed increased, it has become increasingly necessary for the MISFETs to have their sizes further reduced in accordance with the scaling law. In particular, it has become more and more necessary to reduce the width of the sidewall on the gate electrode and a contact margin provided between the gate electrode and the source or drain region of the MISFETs. Also, for the purpose of reducing the resistivity of the source/drain regions, a process for forming a silicide in the surface regions of the source/drain regions and the gate electrode, i.e., a salicide (self-aligned silicide) process, has been adopted more and more often.

When such a salicide process is adopted, it is necessary to prevent the thickness of the sidewall from being reduced too much while a wet etching process is performed using hydrofluoric acid solution before a metal film for the salicide structure is deposited. For this purpose, a silicon nitride film with high resistibility to the wet etching process is generally used for the sidewall. It is also necessary to prevent the source/drain contact from being shortcircuited with the gate electrode or part of the semiconductor substrate located under the sidewall, e.g., extended or LDD (lightly doped drain) regions, even when the source/drain contact has overlapped with the gate electrode or sidewall. For this purpose, an insulating film to be deposited on the gate electrode and the sidewall are usually made of silicon nitride films with high resistibility to a dry etching process. However, it is known that if the silicon nitride film is deposited directly on the side faces of the gate electrode, the following problems will arise. Specifically, stress might be applied to the channel region of the semiconductor substrate from the silicon nitride film. Also, the durability of the gate insulating film to hot carriers decreases because of harmful effects caused by hydrogen atoms contained in the silicon nitride film. In addition, since the silicon nitride film has a high dielectric constant, the capacitance formed between the gate and the source or drain region might increase where the sidewall consists of the silicon nitride film alone. Thus, the operating speed of the circuit might decrease. To eliminate these problems, the sidewall generally has a double-layer structure made up of a nitride film and a silicon dioxide film, which is interposed between the nitride film and gate electrode and between the nitride film and semiconductor substrate.

In addition, MISFETs are also disposed for the I/O ports on the same semiconductor substrate. These MISFETs have a structure with no silicide layer formed in the source/drain regions so as to ensure sufficient durability for the gate oxide film and good electrostatic discharge (ESD) resistibility. That is to say, the single semiconductor substrate includes regions to be silicided and regions not to be silicided.

FIGS. 6A through 6E are cross-sectional views showing a known method for fabricating a semiconductor device with a poly-metal gate structure. In FIGS. 6A through 6E, only an NMISFET region is illustrated. However, a PMISFET actually exists on another part of the substrate.

Figure 6A:
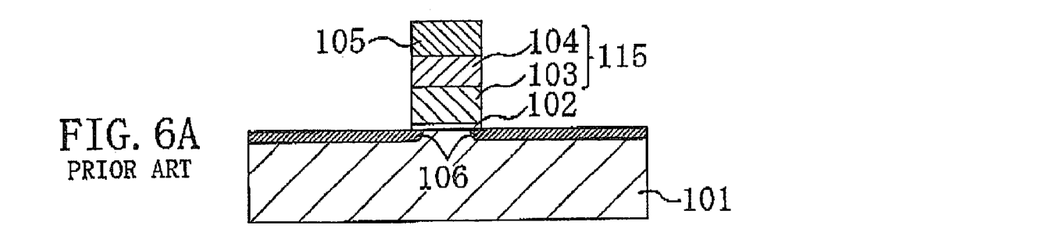
FIGS. 6A through 6E are cross-sectional views showing a known method for fabricating a semiconductor device with a poly-metal gate structure.

First, in the process step shown in FIG. 6A, silicon dioxide, n-polysilicon, metal and silicon nitride films are deposited in this order over a semiconductor substrate 101. Then, a photolithographic process is performed to form a photoresist film as an etching mask over the silicon nitride film. Subsequently, the silicon nitride, metal, polysilicon and silicon dioxide films are patterned by an etching process using the photoresist film as a mask, thereby forming on-gate silicon nitride film 105, upper gate electrode 104 of the metal film, lower gate electrode 103 of the polysilicon film and gate insulating film 102. Thereafter, a photoresist film (not shown) is formed to cover a PMISFET region (now shown). Then, arsenic ions (As$^+$), for example, are introduced into the NMISFET region of the semiconductor substrate 101 at a dose of about $5.0 \times 10^{14}$ atoms·cm$^{-2}$ with an accelerating voltage of about 10 keV applied and with the on-gate silicon nitride film 105 and gate electrodes 104 and 103 used as a masks In this manner, n-type extended (or LDD) regions 106 are defined in the semiconductor substrate 101.

Figure 6B:
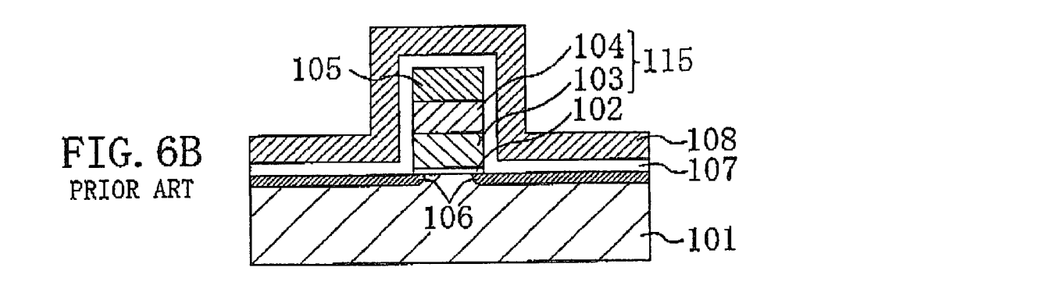

Next, in the process step shown in FIG. 6B, a silicon dioxide film 107 and a silicon nitride film 108 are deposited in this order to thicknesses of about 20 nm and about 80 nm, respectively, over the substrate by an LPCVD (low-pressure chemical vapor deposition) process, for example.

Figure 6C:
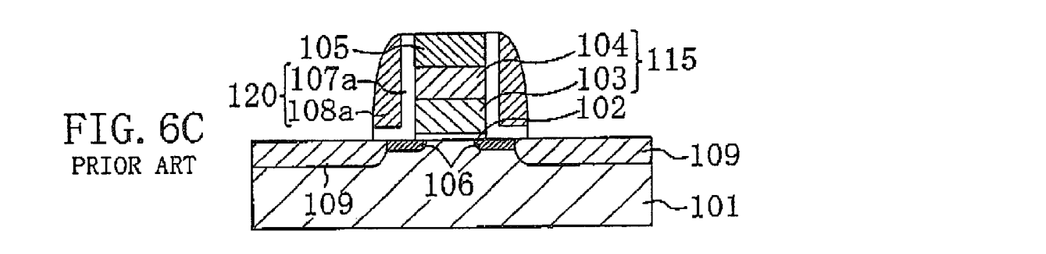

Then, in the process step shown in FIG. 6C, the silicon nitride film 108 and silicon dioxide film 107 are etched back by an anisotropic etching process, thereby forming a nitride sidewall 108a and an L-sidewall 107a having an L-shaped cross section. Thereafter, arsenic ions, for example, are introduced into the semiconductor substrate 101 at a dose of $5.0 \times 10^{15}$ atoms·cm$^{-2}$ with an accelerating voltage of about 50 keV applied and with the on-gate silicon nitride film 105, gate electrodes 104 and 103 and sidewalls 108a and 107a used as a mask. Subsequently, rapid thermal annealing is performed at a temperature of 1000° C. for 10 seconds. In this manner, n-type heavily doped source/drain regions 109 are defined in the semiconductor substrate 101.

Figure 6D:
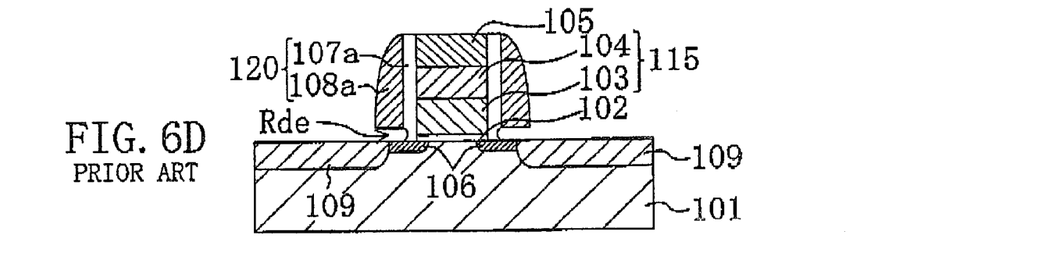

Next, in the process step shown in FIG. 6D, before a silicide layer is formed on the heavily doped source/drain regions 109, the following process steps are performed to prevent the silicide layer from being formed in a region not to be silicided (not shown). Specifically, an antireactive silicon dioxide film is deposited by an LPCVD process, for example, to a thickness of about 50 nm over the substrate. Then, a photoresist film is formed on the antireactive silicon dioxide film so as to cover the region not to be silicided and expose the region to be silicided (e.g., the region shown in FIG. 6D). By using this photoresist film as an etching mask, the antireactive silicon dioxide film is wet-etched by a buffered hydrofluoric acid solution diluted to 1:20, for example, for about 30 seconds. In this manner, part of the antireactive silicon dioxide film located over the region to be silicided is removed. In this case, to remove that part of the antireactive silicon dioxide film as much as possible, the antireactive silicon dioxide film is over-etched. However, as a result of this over-etching, the lower edge of the L-sidewall 107a sandwiched between the nitride sidewall 108a and semiconductor substrate 101 is partially etched. Thus, an oxide-removed region Rde is created as shown in FIG. 6D.

Figure 6E:
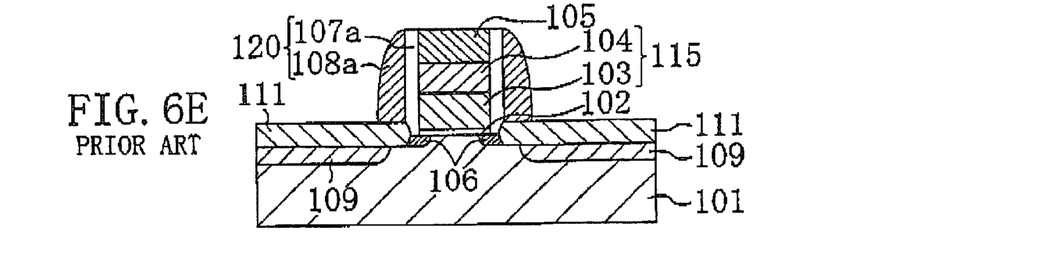

Then, in the process step shown in FIG. 6E, the photoresist film is removed by a process such as ashing or RCA cleaning, during which a silicon dioxide film is formed on the surface of the silicon layer (such as the heavily doped source/drain regions 109). Thus, the silicide dioxide film is wet-etched away by a hydrofluoric acid solution diluted to 1:100, for example. As a result of this process, the L-sidewall 107a is further etched. Subsequently, a Co film is deposited to a thickness of about 8 nm over the substrate and then annealed at a temperature of 550° C. for 60 seconds, for example, thereby allowing Co to react with Si at the interface between the silicon layer and Co film. As a result, a cobalt silicide ($CoSi_2$) layer 111 is formed on the heavily doped source/drain regions 109. Thereafter, non-reacted parts of the Co film are removed by a selective wet etching process.

By performing these process steps, the resultant device is implementable as a MISFET with a so-called "salicide structure" that greatly contributes to downsizing.

However, the known method for fabricating the semiconductor device involves the following drawbacks. Specifically, in the process step shown in FIG. 6D, parts of the semiconductor substrate 101, i.e., parts of the heavily doped source/drain regions 109 and parts of the n-type extended (or LDD) regions 106, are exposed an the oxide-removed region Rde. Thus, the cobalt silicide layer 111 grows laterally in the oxide-removed region Rde under the nitride sidewall 108a. That is to say, parts of the n-type extended (or LDD) regions 106 with a shallow pn junction are silicided. Accordingly, part of the cobalt silicide layer Ill comes into direct contact with a region (i.e., the p-well in this case) of the semiconductor substrate 101. Or that part of the cobalt silicide layer 111 faces the substrate region with the very thin layer of the n-type extended (or LDD) regions 106 sandwiched therebetween. As a result, a non-negligible amount of leakage current flows between the cobalt silicide layer 111 and the substrate region as the p-well. If the substrate includes no n-type extended (or LDD) regions but the heavily doped source/drain regions only, then the silicide layer should be in direct contact with the channel region. Accordingly, the leakage current would further increase in that case.

To eliminate such an oxide-removed region Rde from a double-layer sidewall consisting of L-oxide and nitride sidewalls, the overetched edge of the oxide L-sidewall, i.e., the oxide-removed region Rde, may be filled with another nitride film. (see Japanese Laid-Open Publication No. 11-345963, for example) In that case, however, the additional nitride film is in direct contact with part of the semiconductor substrate near the channel region. As a result, interface states might arise in the semiconductor substrate or the durability of the gate insulating film to hot carriers and the reliability thereof might decrease because of the stress applied to the channel region. In addition, the oxide-removed region, which is as narrow as about 10 to 20 nm in thickness, may be filled incompletely with the additional nitride film depending on the material thereof.

SUMMARY OF THE INVENTION

It is therefore an object of the present invention to prevent various characteristics of a semiconductor device, including a sidewall as a stack of silicon nitride and silicon dioxide films, from degrading due to the direct contact of the additional nitride film with the gate electrode or the semiconductor substrate.

It is another object of this invention to minimize the leakage current, which flows when parts of the source/drain regions are silicided, for a device of that type.

Specifically, a first inventive semiconductor device includes: a substrate having a semiconductor layer therein; a gate insulating film formed on the semiconductor layer; a gate electrode formed on the gate insulating film; a nitride sidewall, which has been formed out of a silicon nitride film to surround the gate electrode; a stress-relaxing sidewall, which is interposed between the gate electrode and the nitride sidewall and between the semiconductor layer and the nitride sidewall so as to have an L-shaped cross section; source/drain regions, which have been defined in parts of the semiconductor layer below the gate electrode to horizontally sandwich the gate electrode therebetween; and a silicide layer formed on the source/drain regions. In this device, at least a lower edge of the stress-relaxing sidewall is made of an oxynitride film.

The first inventive semiconductor device includes the stress-relaxing sidewall. Accordingly, various characteristics of the device, e.g., hot carrier durability and reliability of the gate insulating film, do not degrade because the nitride sidewall is not in contact with the gate electrode or semiconductor layer. In addition, since the lower edge of the stress-relaxing sidewall is made of the oxynitride film, no part of the silicide layer exists under the stress-relaxing sidewall. As a result, the semiconductor device ensures excellent characteristics, such as sufficient hot carrier durability of the gate insulating film with the leakage current reduced greatly.

In one embodiment of the first inventive device, the stress-relaxing sidewall may be entirely made of the oxynitride film, not just the lower edge thereof.

A second inventive semiconductor device includes: a substrate having a semiconductor layer therein; a gate insulating film formed on the semiconductor layer; a gate electrode formed on the gate insulating film; a nitride sidewall formed out of a silicon nitride film; a stress-relaxing insulator sidewall; source/drain regions defined in parts of the semiconductor layer below the gate electrode to horizontally sandwich the gate electrode therebetween; and a silicide layer formed on the source/drain regions. The nitride sidewall surrounds the gate electrode so as to have its lower edge come into contact with the semiconductor layer. The insulator sidewall is interposed between the gate electrode and the nitride sidewall.

The second inventive semiconductor device includes the stress-relaxing insulator sidewall. Accordingly, various characteristics of the device, e.g., hot carrier durability and reliability of the gate insulating film, do not degrade because the nitride sidewall is not in contact with the gate electrode. In addition, since the device includes the nitride sidewall, no part of the silicide layer exists under the insulator sidewall. As a result, the semiconductor device ensures excellent electrical characteristics with the leakage current reduced greatly.

In one embodiment of the second inventive device, the nitride sidewall may be made of a silicon nitride containing silicon at a mole fraction exceeding a mole fraction defined by stoichiometry. Then, even if the nitride sidewall is in contact with the semiconductor layer, it is possible to suppress the application of excessive stress from the nitride sidewall to the semiconductor layer.

In another embodiment, the stress-relaxing insulator sidewall may be made up of an additional nitride sidewall and an oxide sidewall. The additional nitride sidewall may be formed out of another silicon nitride film and interposed between the gate electrode and the nitride sidewall. The oxide sidewall may be interposed between the gate electrode and the additional nitride sidewall and between the semiconductor layer and the additional nitride sidewall so as to have an L-shaped cross section.

A first inventive method for fabricating a semiconductor device includes the steps of: a) forming a gate insulating film and a gate electrode in this order on a semiconductor layer in a substrate; b) depositing an insulating film and a silicon nitride film, which have resistibility to a wet etching process to be performed on an oxide film, in this order over the substrate and then anisotropically etching back the insulating film and the silicon nitride film, thereby forming a nitride sidewall and a stress-relaxing insulating film that surround the gate electrode; c) defining source/drain regions in parts of the semiconductor layer below the gate electrode to horizontally sandwich the gate electrode therebetween; and d) siliciding respective uppermost parts of the source/drain regions. The stress-relaxing insulating film is interposed between the gate electrode and the nitride sidewall and between the semiconductor layer and the nitride sidewall so as to have an L-shaped cross section.

According to the first method, before respective uppermost parts of the source/drain regions are silicided, the lower edge of the stress-relaxing insulating film is not etched. Thus, in the step d), no part of the silicide layer exists under the stress-relaxing insulating film to reach the channel region or extended (or LDD) regions. As a result, the leakage current, which should otherwise flow between the silicide layer and the substrate region, can be reduced greatly in the resultant semiconductor device.

In one embodiment of the first inventive method, a silicon dioxide film may be deposited over the substrate by a chemical vapor deposition process and then annealed and densified in the step b), thereby forming the insulating film having the high resistibility to the wet etching process to be performed on the oxide film.

In another embodiment, a silicon oxynitride film may be formed in the step b) as the insulating film having the high resistibility to the wet etching process to be performed on the oxide film.

A second inventive method for fabricating a semiconductor device includes the steps of: a) forming a gate insulating film and a gate electrode in this order on a semiconductor layer in a substrate; b) depositing a silicon dioxide film and a silicon nitride film in this order over the substrate, and then anisotropically etching back the silicon dioxide film and the silicon nitride film, thereby forming a nitride sidewall and a stress-relaxing oxide film that surround the gate electrode; c) nitriding a lower edge of the stress-relaxing oxide film, thereby changing the lower edge into an oxynitride region; d) defining source/drain regions in parts of the semiconductor layer below the gate electrode to horizontally sandwich the gate electrode therebetween; and e) siliciding respective uppermost parts of the source/drain regions. The stress-relaxing oxide film is interposed between the gate electrode and the nitride sidewall and between the semiconductor layer and the nitride sidewall film so as to have an L-shaped cross section.

According to the second method, the leakage current, which should otherwise flow between the silicide layer and a substrate region, can also be reduced greatly in the resultant semiconductor device as in the first method.

A third inventive method for fabricating a semiconductor device includes the steps of: a) forming a gate insulating film and a gate electrode in this order on a semiconductor layer in a substrate; b) forming a stress-relaxing insulator sidewall around the gate electrode; c) depositing a silicon nitride film over the substrate; d) depositing an antireactive oxide film over the silicon nitride film; e) selectively removing part of the antireactive oxide film located in a region to be silicided while leaving the other part of the antireactive oxide film located in a region not to be silicided; f) anisotropically etching part of the silicon nitride film located in the region to be silicided, thereby forming a nitride sidewall on the insulator sidewall so that the nitride sidewall is in contact with the semiconductor layer; g) defining source/drain regions in parts of the semiconductor layer below the gate electrode to horizontally sandwich the gate electrode therebetween; and h) siliciding respective uppermost parts of the source/drain regions.

According to the third method, the region to be silicided is covered with the silicon nitride film when part of the antireactive oxide film is removed, in the step e), from the region to be silicided. Thus, the lower edge of the insulator sidewall is hardly etched away. Accordingly, in the subsequent step g), no part of the silicide layer exists under the insulator sidewall to reach the channel region or the extended (or LDD) regions. As a result, the leakage current, which should otherwise flow between the silicide layer and the substrate region, can be reduced greatly in the resultant semiconductor device.

In one embodiment of the third inventive method, a silicon dioxide film and a silicon nitride film may be deposited in this order over the substrate and then etched back anisotropically in the step b), thereby forming an additional nitride sidewall and a stress-relaxing oxide film around the gate electrode. The stress-relaxing oxide film may be interposed between the gate electrode and the additional nitride sidewall and between the semiconductor layer and the additional nitride sidewall so as to have an L-shaped cross section.

In another embodiment, the step c) may include forming the silicon nitride film of a silicon nitride containing silicon at a mole fraction exceeding a mole fraction defined by stoichiometry. Then, various unfavorable effects on the device, such as the application of excessive stress from the nitride sidewall to the semiconductor layer, can be reduced as much as possible

DESCRIPTION OF THE PREFERRED EMBODIMENTS

Embodiment 1

FIGS. 1A through 1D are cross-sectional views showing process steps for fabricating a semiconductor device according to a first embodiment of the present invention. In FIGS. 1A through 1D, only an NMISFET region is illustrated.

However, a PMISFET region actually exists on the same substrate. In the PMISFET region, the substrate region, extended (or LDD) regions and heavily doped source/drain regions have conductivity types opposite to those of the counterparts in the NMISFET region.

Figure 1A:
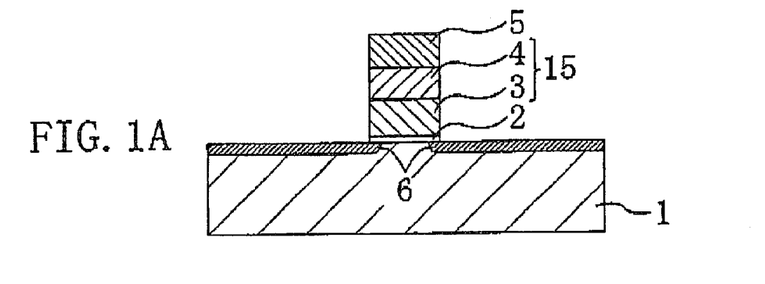
FIGS. 1A through 1D are cross-sectional views showing process steps for fabricating a semiconductor device according to a first embodiment of the present invention.

First, in the process step shown in FIG. 1A, silicon oxynitride film, polysilicon film to be a lower gate electrode, metal film to be an upper gate electrode and silicon nitride film to be an on-gate passivation film are deposited in this order over an Si substrate 1. The silicon oxynitride and polysilicon films are deposited to about 30 nm and about 100 nm, respectively. Then, a photolithographic process is performed to form a resist mask (not shown), which is used to define a desired pattern for the gate electrode, over the silicon nitride film. Subsequently, the silicon nitride, metal, polysilicon and silicon oxynitride films are patterned by a dry etching process using the resist mask, thereby forming on-gate passivation film 5, gate electrode 15 made up of lower and upper gate electrodes 3 and 4, and gate insulating film 2. Thereafter, a resist mask (not shown) is formed to cover the PMISFET region. Then, arsenic ions (As$^+$) are introduced into the NMISFET region of the Si substrate 1 at a dose of about $5.0 \times 10^{14}$ atoms·cm$^{-2}$ with an accelerating voltage of about 10 keV applied. In this manner, n-type extended (or LDD) regions 6 are defined in the Si substrate 1.

Figure 1B:
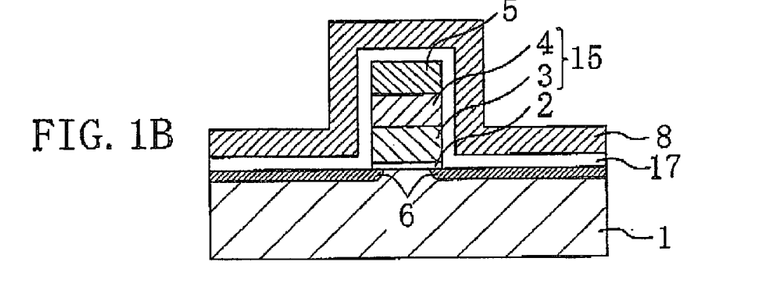

Next, in the process step shown in FIG. 1B, a silicon oxynitride film 17 and a silicon nitride film 8 are deposited in this order to thicknesses of about 20 nm and about 80 nm, respectively, over the substrate by an LPCVD process.

Figure 1C:
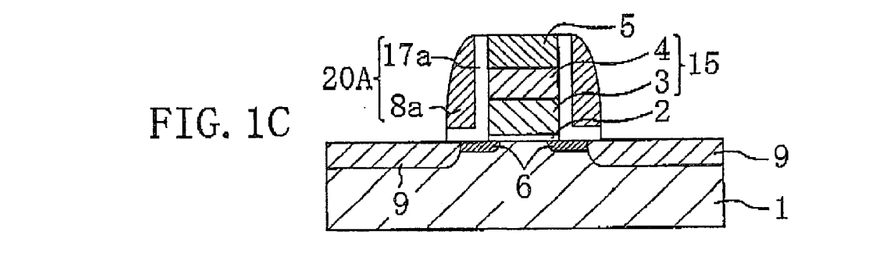

Then, in the process step shown in FIG. 1C, the silicon nitride film 8 and silicon oxynitride film 17 are anisotropically etched, thereby forming a sidewall 20A, which is a stack of a nitride sidewall 8a and an oxynitride sidewall 17a having an L-shaped cross section, on the side faces of the gate electrode 15 and on-gate passivation film 5. Thereafter, arsenic ions (As$^+$) are introduced into the Si substrate 1 at a dose of about $5.0 \times 10^{15}$ atoms·cm$^{-2}$ with an accelerating voltage of about 50 keV applied and with the on-gate passivation film 5, gate electrode 15 and stacked sidewall 20A used as a mask. Subsequently, rapid thermal annealing is performed at a temperature of 1000° C. for 10 seconds. In this manner, n-type heavily doped source/drain regions 9 are defined in the Si substrate 1.

Figure 1D:
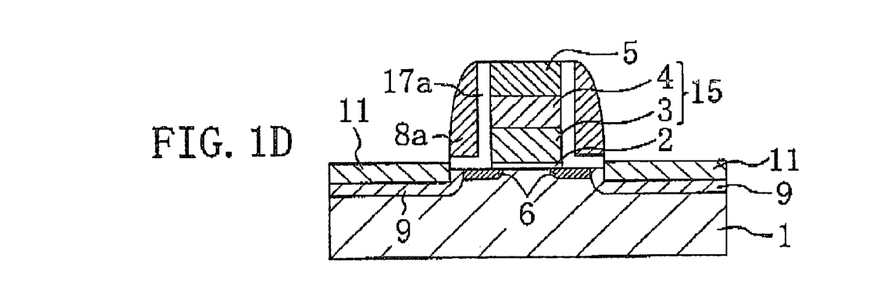

Next, in the process step shown in FIG. 1D, before a silicide layer is formed on the heavily doped source/drain regions 9, the following process steps are performed to prevent the silicide layer from being formed in a region not to be silicided (not shown). Specifically, an antireactive silicon dioxide film is deposited by an LPCVD process, for example, to a thickness of about 50 nm over the substrate. Then, a photoresist film is formed on the antireactive silicon dioxide film so as to cover the region not to be silicided and expose the region to be silicided (e.g., the region shown in FIG. 1D). By using this photoresist film as an etching mask, the antireactive silicon dioxide film is wet-etched by a buffered hydrofluoric acid solution diluted to 1:20, for example, for about 30 seconds. In this manner, part of the antireactive silicon dioxide film, covering the region to be silicided, is removed. In this case, to remove that part of the antireactive silicon dioxide film as much as possible, the antireactive silicon dioxide film is over-etched. However, the nitride and L-oxynitride sidewalls 8a and 17a both show high resistibility to the etching process using the hydrofluoric acid solution, and are hardly etched away. That is to say, no oxide-removed regions Rde as shown in FIG. 6D are created.

Thereafter, the photoresist film is removed by a process such as ashing or RCA cleaning, during which a silicon dioxide film is formed on the surface of the silicon layer (such as the heavily doped source/drain regions 9). Thus, the silicide dioxide film is wet-etched away by a hydrofluoric acid solution diluted to 1:100, for example. As a result of this process, the nitride and L-oxynitride sidewalls 8a and 17a are hardly etched, either. Subsequently, a Co film is deposited to a thickness of about 8 nm over the substrate and then annealed at a temperature of 550° C. for 60 seconds, for example, thereby allowing Co to react with Si at the interface between the silicon layer and Co film. As a result, a cobalt silicide (CoSi$_2$) layer 11 is formed on the heavily doped source/drain regions 9. Thereafter, non-reacted parts of the Co film are removed by a selective wet etching process.

In the semiconductor device and method for fabricating the device in accordance with this embodiment, the L-oxynitride sidewall 17a on the Si substrate 1 remains unetched by the hydrofluoric acid solution in the process step shown in FIG. 1D. Thus, no oxide-removed regions Rde as shown in FIG. 6D are created, and almost no part of the cobalt silicide layer 11 exists under the stacked sidewall 20A. That is to say, the cobalt silicide layer 11 is formed substantially nowhere but outside of the lower edge of the stacked sidewall 20A. Thus, the cobalt silicide layer 11 does not extend laterally to reach the n-type extended (or LDD) regions 6 having a shallow junction. Accordingly, the bottom of the cobalt silicide layer 11 is surrounded by the heavily doped source/drain regions 9. As a result, the leakage current, which should otherwise flow between the cobalt silicide layer 11 and the substrate region (i.e., the p-well in this case) of the Si substrate 1, can be reduced greatly.

Also, the nitride sidewall 8a is not in contact with the gate electrode 15 or Si substrate 1. Thus, it is possible to suppress the occurrence of interface states in the Si substrate 1 or decrease in hot carrier durability and reliability of the gate insulating film 2 due to the excessive stress applied from the nitride sidewall 8a to the channel region.

In the method of this embodiment, the silicon oxynitride film 17 is deposited by the LPCVD process in the process step shown in FIG. 1B. However, the method of the present invention is not limited to this embodiment. For example, the silicon oxynitride film may be formed either by a plasma CVD process or by depositing a silicon dioxide film first and then nitriding the silicon dioxide film in an ammonia (NH$_3$) or N$_2$O gas.

Embodiment 2

Figure 2A:
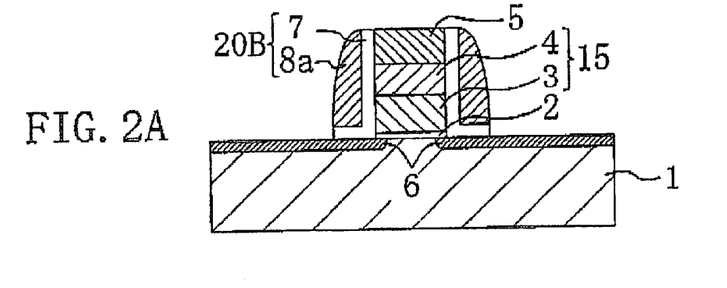
FIGS. 2A through 2C are cross-sectional views showing process steps for fabricating a semiconductor device according to a second embodiment of the present invention.
Figure 2B:
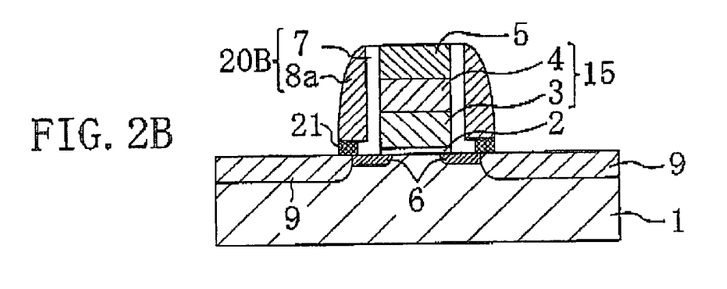
Figure 2C:
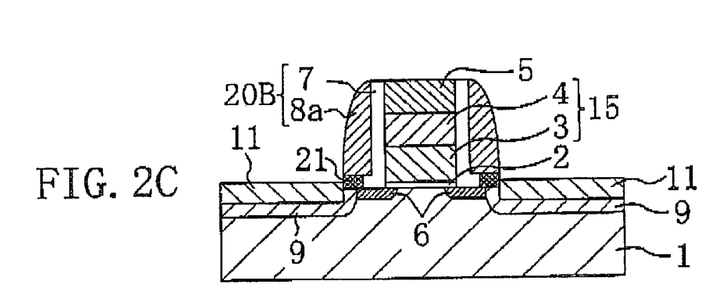

FIGS. 2A through 2C are cross-sectional views showing process steps for fabricating a semiconductor device according to a second embodiment of the present invention. In FIGS. 2A through 2C, only an NMISFET region is illustrated. However, a PMISFET region actually exists on the same substrate. In the PMISFET region, the substrate region, extended (or LDD) regions and heavily doped source/drain regions have conductivity types opposite to those of the counterparts in the NMISFET region.

First, in the process step shown in FIG. 2A, silicon oxynitride film, polysilicon film to be a lower gate electrode, metal film to be an upper gate electrode and silicon nitride film to be an on-gate passivation film are deposited in this order over an Si substrate 1. The silicon oxynitride and polysilicon films are deposited to about 30 nm and about 100 nm, respectively. Then, a photolithographic process is performed to form a resist mask (not shown), which is used to define a desired pattern for the gate electrode, over the silicon nitride film. Subsequently, the silicon nitride, metal, polysilicon and silicon oxynitride films are patterned by a dry etching process using the resist mask, thereby forming on-gate passivation film 5, gate electrode 15 made up of upper and lower gate electrodes 4 and 3, and gate insulating film 2. Thereafter, a resist mask (not shown) is formed to cover the PMISFET region. Then, arsenic ions (As$^+$) are introduced into the NMISFET region of the Si substrate 1 at a dose of about $5.0 \times 10^{14}$ atoms·cm$^{-2}$ with an accelerating voltage of about 10 keV applied. In this manner, n-type extended (or LDD) regions 6 are defined in the Si substrate 1.

Next, a silicon dioxide film and a silicon nitride film are deposited in this order to thicknesses of about 20 nm and about 80 nm, respectively, over the substrate by an LPCVD process. Then, the silicon nitride film and silicon dioxide film are anisotropically etched, thereby forming a sidewall 20B, which is a stack of a nitride sidewall 8a and an oxide sidewall 7 having an L-shaped cross section, on the side faces of the gate electrode 15 and on-gate passivation film 5.

Thereafter, in the process step shown in FIG. 2B, arsenic ions (As$^+$) are introduced into the Si substrate 1 at a dose of about $5.0 \times 10^{15}$ atoms·cm$^{-2}$ with an accelerating voltage of about 50 keV applied and with the on-gate passivation film 5, gate electrode 15 and stacked sidewall 20B used as a mask. Subsequently, rapid thermal annealing is performed at a temperature of 1000° C. for 10 seconds in an ambient containing nitrogen (e.g., NH$_3$ or N$_2$O gas), thereby defining n-type heavily doped source/drain regions 9 in the Si substrate 1 and forming an oxynitride region 21 with the exposed lower edge of the oxide sidewall 7 nitrided. Alternatively, an annealing process for activating the dopant that has been introduced to define the heavily doped source/drain regions 9 and an annealing process for forming the oxynitride region 21 may be separately performed. In that case, the latter annealing process is preferably performed at a temperature of about 900° C., for example, which is lower than that of the former annealing process. Also, the oxynitride region 21 may be formed by a plasma process performed in an ambient containing nitrogen.

Then, in the process step shown in FIG. 2C, before a silicide layer is formed on the heavily doped source/drain regions 9, the following process steps are performed to prevent the silicide layer from being formed in a region not to be silicided (not shown). Specifically, an antireactive silicon dioxide film is deposited by an LPCVD process, for example, to a thickness of about 50 nm over the substrate. Then, a photoresist film is formed on the antireactive silicon dioxide film so as to cover the region not to be silicided and expose the region to be silicided (e.g., the region shown in FIG. 2C). By using this photoresist film as an etching mask, the antireactive silicon dioxide film is wet-etched by a buffered hydrofluoric acid solution dilated to 1:20, for example, for about 30 seconds. In this manner, part of the antireactive silicon dioxide film, covering the region to be silicided, is removed. In this case, to remove that part of the antireactive silicon dioxide film as much as possible, the antireactive silicon dioxide film is over-etched. However, the nitride sidewall 8a and the oxynitride region 21, located at the lower edge of the L-oxide sidewall 17a, both show high resistibility to the etching process using the hydrofluoric acid solution, and are hardly etched away. That is to say, no oxide-removed regions Rde as shown in FIG. 6D are created.

Thereafter, the photoresist film is removed by a process such as ashing or RCA cleaning, during which a silicon dioxide film is formed on the surface of the silicon layer (such as the heavily doped source/drain regions 9). Thus, the silicide dioxide film is wet-etched away by a hydrofluoric acid solution diluted to 1:100, for example. As a result of this process, the nitride sidewall 8a and the oxynitride region 21 of the L-oxide sidewall 17a are hardly etched, either. Subsequently, a Co film is deposited to a thickness of about 8 nm over the substrate and then annealed at a temperature of 550° C. for 60 seconds, for example, thereby allowing Co to react with Si at the interface between the silicon layer and Co film. As a result, a cobalt silicide (CoSi$_2$) layer 11 is formed on the heavily doped source/drain regions 9. Thereafter, non-reacted parts of the Co film are removed by a selective wet etching process.

In the semiconductor device and method for fabricating the device in accordance with this embodiment, the oxynitride region 21 of the L-oxide sidewall 7 formed on the Si substrate 1 remains unetched by the hydrofluoric acid solution in the process step shown in FIG. 2C. Thus, no oxide-removed regions Rde as shown in FIG. 6D are created, and almost no part of the cobalt silicide layer 11 exists under the stacked sidewall 20B. That is to say, the cobalt silicide layer 11 is formed substantially nowhere but outside of the lower edge of the stacked sidewall 20B. Thus, the cobalt silicide layer 11 does not extend laterally to reach the n-type extended (or LDD) regions 6 having a shallow junction. Accordingly, the bottom of the cobalt silicide layer 11 is surrounded by the heavily doped source/drain regions 9. As a result, the leakage current, which should otherwise flow between the cobalt silicide layer 11 and the substrate region (i.e., the p-well in this case) of the Si substrate 1, can be reduced greatly.

Also, the nitride sidewall 8 is not in contact with the gate electrode 15 or Si substrate 1. Thus, it is possible to suppress the occurrence of interface states in the Si substrate 1 or decrease in hot carrier durability and reliability of the gate insulating film 2 due to the excessive stress applied from the nitride sidewall 8 to the channel region.

Embodiment 3

FIGS. 3A through 3D are cross-sectional views showing process steps for fabricating a semiconductor device according to a third embodiment of the present invention. For the first and second embodiments, the process steps on the region to be silicided have been described. As for the third embodiment, however, regions to be silicided and not to be silicided Rsc and Rns are shown in FIGS. 3A through 3D. In FIGS. 3A through 3D, only two NMISFET regions are illustrated. However, a PMISFET region actually exists on the same substrate. In the PMISFET region, the substrate region, extended (or LDD) regions and heavily doped source/drain regions have conductivity types opposite to those of the counterparts in the NMISFET regions.

Figure 3A:
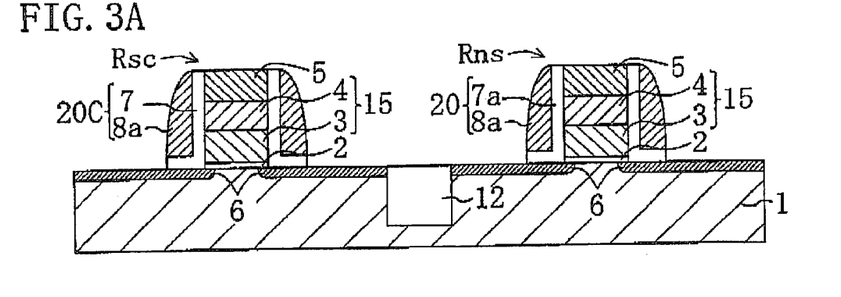
FIGS. 3A through 3D are cross-sectional views showing process steps for fabricating a semiconductor device according to a third embodiment of the present invention.

First, in the process step shown in FIG. 3A, a trench isolation 12 is formed in an Si substrate 1 to define the region to be silicided Rsc and the region not to be silicided Rns. Then, silicon oxynitride film, polysilicon film to be a lower gate electrode, metal film to be an upper gate electrode and silicon nitride film to be an on-gate passivation film are deposited in this order over the regions to be silicided and not to be silicided Rsc and Rns of the Si substrate 1. The silicon oxynitride and polysilicon films are deposited to about 30 nm and about 100 nm, respectively. Then, a photolithographic process is performed to form a resist mask (not shown), which is used to define a desired pattern for the gate electrodes, over the silicon nitride film. Subsequently, the silicon nitride, metal, polysilicon and silicon oxynitride films are patterned by a dry etching process using the resist mask, thereby forming on-gate passivation film 5, gate electrode 15 made up of upper and lower gate electrodes 4 and 3, and gate insulating film 2 on each of the NMISFET regions. Thereafter, a resist mask (not shown) is formed to cover the PMISFET region. Then, arsenic ions (As$^+$) are introduced into the NMISFET regions of the Si substrate 1 at a dose of about $5.0 \times 10^{14}$ atoms·cm$^{-2}$ with an accelerating voltage of about 10 keV applied. In this manner, n-type extended (or LDD) regions 6 are defined in the Si substrate 1.

Next, a silicon dioxide film and a silicon nitride film are deposited in this order to thicknesses of about 20 nm and about 80 nm, respectively, over both of the regions to be silicided and not to be silicided Rsc and Rns of the substrate by an LPCVD process. Then, the silicon nitride and silicon dioxide films are anisotropically etched, thereby forming sidewalls 20C and 20, each of which is a stack of a nitride sidewall 8a and an oxide sidewall 7 having an L-shaped cross section, on the side faces of the gate electrodes 15 and on-gate passivation films 5.

Figure 3B:
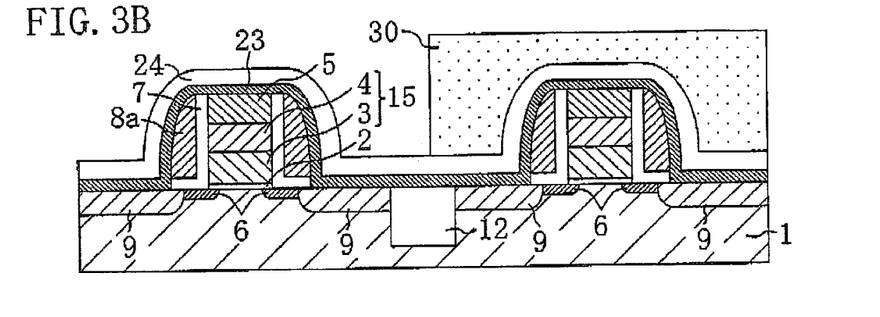

Thereafter, in the process step shown in FIG. 3B, arsenic ions (As$^+$) are introduced into both of the regions to be silicided and not to be silicided Rsc and Rns of the Si substrate 1 at a dose of about $5.0 \times 10^{15}$ atoms·cm$^{-2}$ with an accelerating voltage of about 50 keV applied and with the on-gate passivation films 5, gate electrodes 15 and stacked sidewalls 20C and 20 used as a mask. Subsequently, rapid thermal annealing is performed at a temperature of 1000° C. for 10 seconds. In this manner, n-type heavily doped source/drain regions 9 are defined in the Si substrate 1.

Then, before a silicide layer is formed on the heavily doped source/drain regions 9, the following process steps are performed to prevent the silicide layer from being formed in the region not to be silicided Rns. Specifically, a silicon nitride film 23 and a silicon dioxide film 24 (i.e., an antireactive silicon dioxide film) are deposited in this order by an LPCVD process, for example, to about 5 nm and about 50 nm, respectively, over the substrate. Then, a photoresist film 30 is formed on the silicon dioxide film 24 so as to cover the region not to be silicided Rns and expose the region to be silicided Rsc.

Figure 3C:
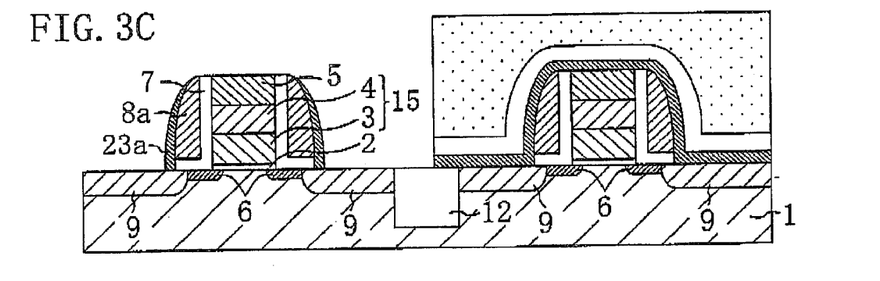

Thereafter, in the process step shown in FIG. 3C, the silicon dioxide film 24 is wet-etched for about 30 seconds by a buffered hydrofluoric acid solution diluted to 1:20, for example, with the photoresist film 30 used as an etching mask. In this manner, part of the silicon dioxide film 24, covering the region to be silicided Rsc, is removed. In this case, to remove that part of the silicon dioxide film 24 as much as possible, the silicon dioxide film 24 is over-etched. However, since the region to be silicided Rsc is covered with the silicon nitride film 23, the lower edge of the L-oxide sidewall 7 is hardly etched away. That is to say, no oxide-removed regions Rde as shown in FIG. 6D are created.

Subsequently, the exposed part of the silicon nitride film 23 is etched back by a dry (anisotropic) etching process, thereby forming a nitride sidewall 23a that covers the side faces of the stacked sidewall 20c consisting of the oxide and nitride sidewalls 7 and 8a. In this case, the silicon nitride film 23 is as thin as 5 nm, and can be etched back almost without removing the on-gate passivation film 5 of silicon nitride.

Figure 3D:
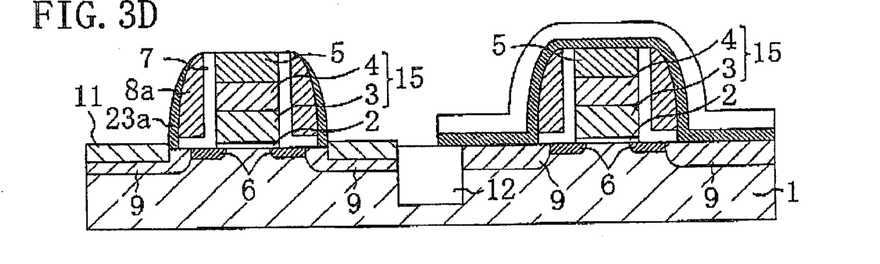

Thereafter, in the process step shown in FIG. 3D, the photoresist film is removed by a process such as ashing or RCA cleaning, during which a silicon dioxide film is formed on the surface of the exposed silicon layer (such as the heavily doped source/drain regions 9). Thus, the silicide dioxide film is wet-etched away by a hydrofluoric acid solution diluted to 1:100 for example. As a result of this process, the lower side edge of the L-oxide sidewall 7a is hardly etched, either, because the edge is covered with the nitride sidewall 23a. Subsequently, a Co film is deposited to a thickness of about 8 nm over the substrate and then annealed at a temperature of 550° C. for 60 seconds, for example, thereby allowing Co to react with Si at the interface between the silicon layer and Co film. As a result, a cobalt silicide (CoSi$_2$) layer 11 is formed on the exposed heavily doped source/drain regions 9. Thereafter, non-reacted parts of the Co film are removed by a selective wet etching process.

In the semiconductor device and method for fabricating the device in accordance with this embodiment, the lower edge of the L-oxide sidewalls 7 is covered with the silicon nitride film 23 or nitride sidewall 23a, and remains almost unetched by the hydrofluoric acid solution. Thus, no oxide-removed regions Rde as shown in FIG. 6D are created, and almost no part of the cobalt silicide layer 11 exists under the stacked sidewall 20C. That is to say, the cobalt silicide layer 11 is formed substantially nowhere but outside of the lower edge of the stacked sidewall 20C. Thus, the cobalt silicide layer 11 does not extend laterally to reach the n-type extended (or LDD) regions 6 having a shallow junction. Accordingly, the bottom of the cobalt silicide layer 11 is surrounded by the heavily doped source/drain regions 9. As a result, the leakage current, which should otherwise flow between the cobalt silicide layer 11 and the substrate region (i.e., the p-well in this case) of the Si substrate 1, can be reduced greatly.

Also, the nitride sidewall 8 is not in contact with the gate electrode 15. Thus, it is possible to suppress decrease in hot carrier durability and reliability of the gate insulating film 2 due to the excessive stress applied from the nitride sidewall 8 to the channel region. The nitride sidewall 23a is in contact with just a small area of the Si substrate 1 but is separated from the channel region with the oxide sidewall 7 interposed therebetween. Thus, the nitride sidewall 23a has almost no harmful effects on the operation of the MISFET.

In this embodiment, the nitride sidewall 23a may be made of a silicon nitride film containing silicon at a mole fraction exceeding that defined by the stoichiometry (Si$_3$N$_4$) as in a fourth embodiment to be described below. A silicon nitride film with such a composition will be herein referred to as a "silicon-rich silicon nitride film". Then, the unfavorable effects on MISFETs can be reduced even more effectively.

Embodiment 4

FIGS. 4A through 4D are cross-sectional views showing process steps for fabricating a semiconductor device according to a fourth embodiment of the present invention. In FIGS. 4A through 4D, only an NMISFET region is illustrated. However, a PMISFET region actually exists on the same substrate. In the PMISFET region, the substrate region, extended (or LDD) regions and heavily doped source/drain regions have conductivity types opposite to those of the counterparts in the NMISFET region.

Figure 4A:
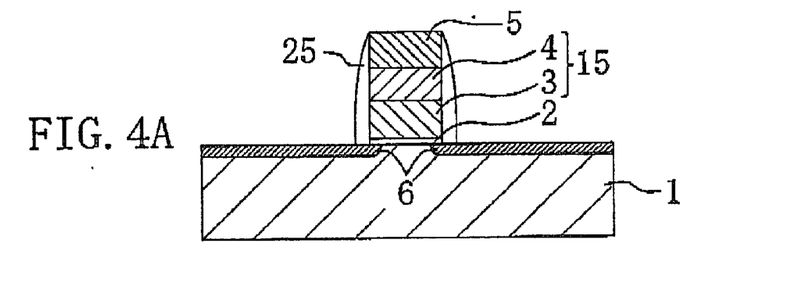
FIGS. 4A through 4D are cross-sectional views showing process steps for fabricating a semiconductor device according to a fourth embodiment of the present invention.

First, in the process step shown in FIG. 4A, silicon oxynitride film, polysilicon film to be a lower gate electrode, metal film to be an upper gate electrode and silicon nitride film to be an on-gate passivation film are deposited in this order over an Si substrate 1. The silicon oxynitride and polysilicon films are deposited to about 30 nm and about 100 nm, respectively. Then, a photolithographic process is performed to form a resist mask (not shown), which is used to define a desired pattern for the gate electrode, over the silicon nitride film. Subsequently, the silicon nitride, metal, polysilicon and silicon oxynitride films are patterned by a dry etching process using the resist mask, thereby forming on-gate passivation film 5, gate electrode 15 made up of upper and lower gate electrodes 4 and 3, and gate insulating film 2. Thereafter, a resist mask (not shown) is formed to cover the PMISFET region. Then, arsenic ions (As$^+$) are introduced into the NMISFET region of the Si substrate 1 at a dose of about $5.0 \times 10^{14}$ atoms·cm$^{-2}$ with an accelerating voltage of about 10 keV applied. In this manner, n-type extended (or LDD) regions 6 are defined in the Si substrate 1.

Next, a silicon dioxide film is deposited to a thickness of about 20 nm over the substrate by an LPCVD process. Then, the silicon dioxide film is anisotropically etched, thereby forming an oxide sidewall 25 on the side faces of the gate electrode 15 and on-gate passivation film 5.

Figure 4B:
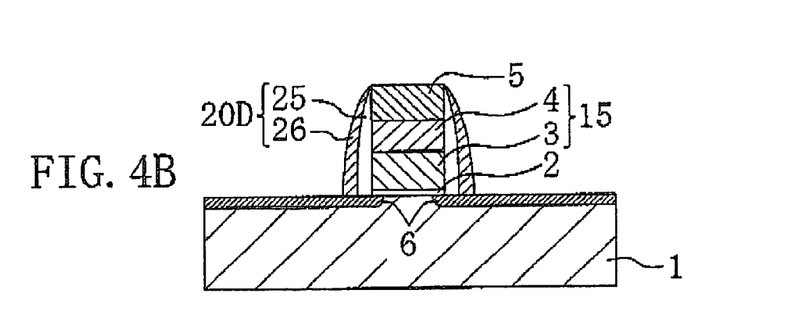

Then, in the process step shown in FIG. 4B, a silicon nitride film, containing silicon at a mole fraction exceeding that defined by the stoichiometry, is deposited to a thickness of about 80 nm over the substrate. Then, the silicon-rich silicon nitride film is etched back by a dry (anisotropic) etching process, thereby forming a nitride sidewall 26 that covers the oxide sidewall 25. In this embodiment, a sidewall 20D is formed as a stack of the oxide and nitride sidewalls 25 and 26. This nitride sidewall 26 is made of a silicon nitride with a composition $Si_{1-x}N_x$ where $2/7 < x < 4/7$. That is to say, the nitride sidewall 26 is made of a silicon nitride containing silicon at a mole fraction exceeding that of $Si_3N_4$ (where $x = 4/7$).

Figure 4C:
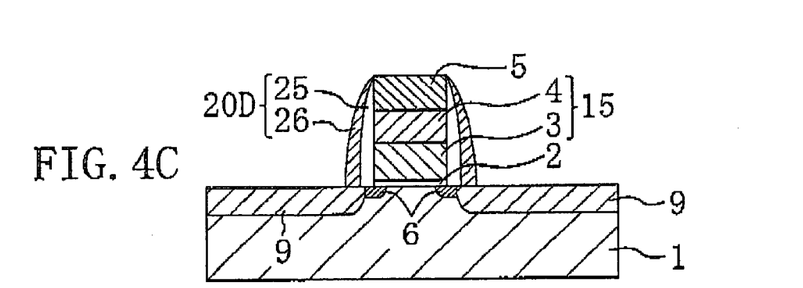

Thereafter, in the process step shown in FIG. 4C, arsenic ions (As$^+$) are introduced into the Si substrate 1 at a dose of about $5.0 \times 10^{15}$ atoms·cm$^{-2}$ with an accelerating voltage of about 50 keV applied and with the on-gate passivation film 5, gate electrode 15 and stacked sidewall 20D used as a mask. Subsequently, rapid thermal annealing is performed at a temperature of 1000° C. for 10 seconds. In this manner, n-type heavily doped source/drain regions 9 are defined in the Si substrate 1.

Figure 4D:
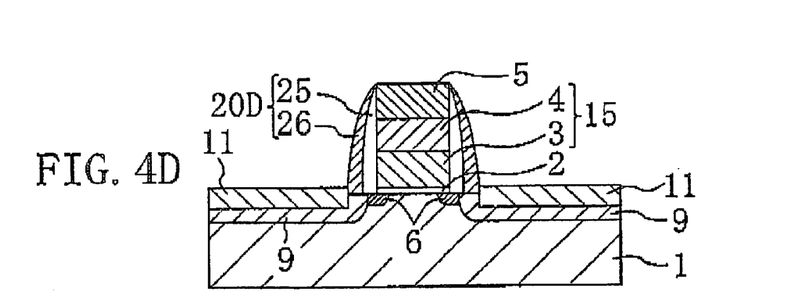

Then, in the process step shown in FIG. 4D, before a silicide layer is formed on the heavily doped source/drain regions 9, the following process steps are performed as in the third embodiment to prevent the silicide layer from being formed in a region not to be silicided (not shown). Specifically, an antireactive silicon dioxide film is deposited by an LPCVD process, for example, to a thickness of about 50 nm over the substrate. Then, a photoresist film is formed on the antireactive silicon dioxide film so as to cover the region not to be silicided and expose the region to be silicided (e.g., the region shown in FIG. 4D). By using this photoresist film as an etching mask, the antireactive silicon dioxide film is wet-etched by a buffered hydrofluoric acid solution diluted to 1:20, for example, for about 30 seconds. In this manner, part of the antireactive silicon dioxide film, covering the region to be silicided, is removed. In this case, to remove that part of the antireactive silicon dioxide film as much as possible, the antireactive silicon dioxide film is over-etched. However, the lower side edge of the oxide sidewall 25, included in the stacked sidewall 20D is hardly etched away because the oxide sidewall 25 is covered with the nitride sidewall 26 showing high resistibility to the etching process using the hydrofluoric acid solution. That is to say, no oxide-removed regions Rde as shown in FIG. 6D are created.

Thereafter, the photoresist film is removed by a process such as ashing or RCA cleaning, during which a silicon dioxide film is formed on the surface of the silicon layer (such as the heavily doped source/drain regions 9). Thus, the silicide dioxide film is wet-etched away by a hydrofluoric acid solution diluted to 1:100, for example. As a result of this process, the lower edge of the oxide sidewall 25 is hardly etched, either, because the edge is covered with the nitride sidewall 26. Subsequently, a Co film is deposited to a thickness of about 8 nm over the substrate and then annealed at a temperature of 550° C. for 60 seconds, for example, thereby allowing Co to react with Si at the interface between the silicon layer and Co film. As a result, a cobalt silicide ($CoSi_2$) layer 11 is formed on the heavily doped source/drain regions 9. Thereafter, non-reacted parts of the Co film are removed by a selective wet etching process.

In the semiconductor device and method for fabricating the device in accordance with this embodiment, the lower edge of the oxide sidewall 25 formed on the Si substrate 1 remains unetched by the hydrofluoric acid solution in the process step shown in FIG. 4D. Thus, no oxide-removed regions Rde as shown in FIG. 6D are created, and almost no part of the cobalt silicide layer 11 exists under the stacked sidewall 20D. That is to say, the cobalt silicide layer 11 is formed substantially nowhere but outside of the lower edge of the stacked sidewall 20D. Thus, the cobalt silicide layer 11 does not extend laterally to reach the n-type extended (or LDD) regions 6 having a shallow junction. Accordingly, the bottom of the cobalt silicide layer 11 is surrounded by the heavily doped source/drain regions 9. As a result, the leakage current, which should otherwise flow between the cobalt silicide layer 11 and the substrate region (i.e., the p-well in this case) of the Si substrate 1, can be reduced greatly.

Also, the nitride sidewall 26 is not in contact with the gate electrode 15. Thus, it is possible to suppress decrease in hot carrier durability and reliability of the gate insulating film 2 due to the excessive stress applied from the nitride sidewall 26 to the channel region. The nitride sidewall 26 is in contact with just a small area of the Si substrate 1 but is separated from the channel region with the oxide sidewall 25 interposed therebetween. Thus, the nitride sidewall 26 has almost no harmful effects on the operation of the MISFET. In particular, the nitride sidewall 26 of this embodiment contains silicon at a mole fraction exceeding that defined by the stoichiometry ($Si_3N_4$). Accordingly, the unfavorable effects on MISFETs can be reduced even more effectively. However, the nitride sidewall 26 does not always have to be made of such a silicon-rich silicon nitride film when the structure of this embodiment is adopted.

Embodiment 5

FIGS. 5A through 5D are cross-sectional views showing process steps for fabricating a semiconductor device according to a fifth embodiment of the present invention. In FIGS. 5A through 5D, only an NMISFET region is illustrated. However, a PMISFET region actually exists on the same substrate. In the PMISFET region, the substrate region, extended (or LDD) regions and heavily doped source/drain regions have conductivity types opposite to those of the counterparts in the NMISFET region.

Figure 5A:
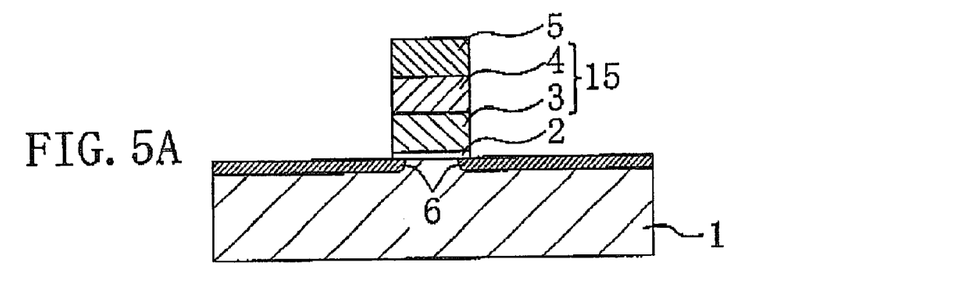
FIGS. 5A through 5D are cross-sectional views showing process steps for fabricating a semiconductor device according to a fifth embodiment of the present invention.

First, in the process step shown in FIG. 5A, silicon oxynitride film, polysilicon film to be a lower gate electrode, metal film to be an upper gate electrode and silicon nitride film to be an on-gate passivation film are deposited in this order over an Si substrate 1. The silicon oxynitride and polysilicon films are deposited to about 30 nm and about 100 nm, respectively. Then, a photolithographic process is performed to form a resist mask (not shown), which is used to define a desired pattern for the gate electrode, over the silicon nitride film. Subsequently, the silicon nitride, metal, polysilicon and silicon oxynitride films are patterned by a dry etching process using the resist mask, thereby forming on-gate passivation film 5, gate electrode 15 made up of lower and upper gate electrodes 3 and 4, and gate insulating film 2. Thereafter, a resist mask (not shown) is formed to cover the PMISFET region. Then, arsenic ions (As$^+$) are introduced into the NMISFET region of the Si substrate 1 at a dose of about $5.0\times10^{14}$ atoms·cm$^{-2}$ with an accelerating voltage of about 10 keV applied. In this manner, n-type extended (or LDD) regions 6 are defined in the Si substrate 1.

Figure 5B:
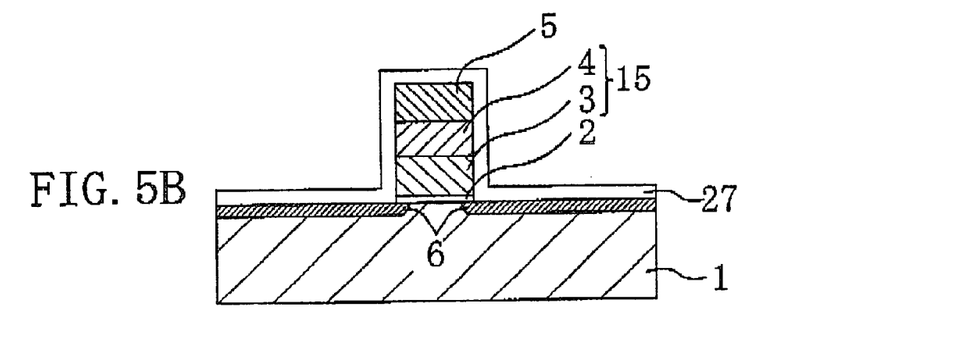

Next, in the process step shown in FIG. 5B, a non-doped low temperature oxide (LTO) film 27 is deposited by an LPCVD process at a temperature of about 400° C. to a thickness of about 20 nm over the substrate. Thereafter, for the purposes of densifying the LTO film 27 and activating the dopant that has been introduced to define the n-type extended (or LDD) regions 6, rapid thermal annealing (RTA) is performed at a temperature of about 850° C. for 10 seconds in an $N_2$ ambient. As a result of this RTA process, the LTO film 27, having a relatively large number of internal air gaps, has its density increased greatly and its thickness reduced.

This annealing process may be performed at a temperature somewhere between 800° C. and 1000° C.

Figure 5C:
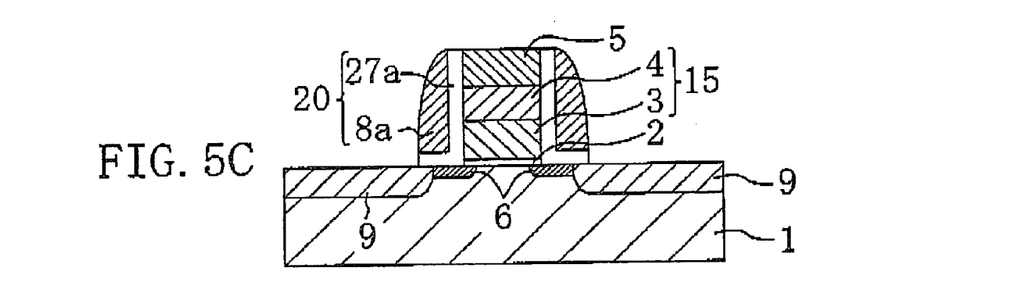

Then, in the process step shown in FIG. 5C, a silicon nitride film 8 (not shown in FIG. 5C but in FIG. 1B) is deposited to a thickness of about 80 nm over the LTO film 27 by an LPCVD process. Thereafter, the silicon nitride and LTO films 8 and 27 are anisotropically etched, thereby forming a sidewall 20E, which is a stack of a nitride sidewall 8a and an LTO sidewall 27a having an L-shaped cross section, on the side faces of the gate electrode 15 and on-gate passivation film 5. Subsequently, arsenic ions (As$^+$) are introduced into the Si substrate 1 at a dose of about $5.0\times10^{15}$ atoms·cm$^{-2}$ with an accelerating voltage of about 50 keV applied and with the on-gate passivation film 5, gate electrode 15 and stacked sidewall 20E used as a mask. Then, rapid thermal annealing is performed at a temperature of 1000° C. for 10 seconds. In this manner, n-type heavily doped source/drain regions 9 are defined in the Si substrate 1.

Subsequently, in the process step shown in FIG. 5D, before a silicide layer is formed on the heavily doped source/drain regions 9, the following process steps are performed to prevent the silicide layer from being formed in a region not to be silicided (not shown). Specifically, an antireactive silicon dioxide film is deposited by an LPCVD process, for example, to a thickness of about 50 nm over the substrate. Then, a photoresist film is formed on the antireactive silicon dioxide film so as to cover the region not to be silicided and expose the region to be silicided (e.g., the region shown in FIG. 5D). By using this photoresist film as an etching mask, the antireactive silicon dioxide film is wet-etched by a buffered hydrofluoric acid solution diluted to 1:20, for example, for about 30 seconds. In this manner, part of the antireactive silicon dioxide film, covering the region to be silicided is removed. In this case, to remove that part of the antireactive silicon dioxide film as much as possible, the antireactive silicon dioxide film is overetched. However, the nitride sidewall 8a is not etched away because the sidewall 8a shows high resistibility to the etching process using the hydrofluoric acid solution. The L-LTO sidewall 27a that has had its density increased by the annealing process also is much more resistible to the etchant (i.e., the hydrofluoric acid solution in this case) than the antireactive silicon dioxide film. Thus, if the over-etching conditions are appropriately controlled, the LTO sidewall 27a is hardly removed. That is to say, no oxide-removed regions Rde as shown in FIG. 6D are created.

Thereafter, the photoresist film is removed by a process such as ashing or RCA cleaning, during which a silicon dioxide film is formed on the surface of the silicon layer (such as the heavily doped source/drain regions 9). Thus, the silicide dioxide film is wet-etched away by a hydrofluoric acid solution diluted to 1:100, for example. As a result of this process, the nitride and L-LTO sidewalls 8a and 27a are hardly etched, either. Subsequently, a Co film is deposited to a thickness of about 8 nm over the substrate and then annealed at a temperature of 550° C. for 60 seconds, for example, thereby allowing Co to react with Si at the interface between the silicon layer and Co film. As a result, a cobalt silicide ($CoSi_2$) layer 11 is formed on the heavily doped source/drain regions 9. Thereafter, non-reacted parts of the Co film are removed by a selective wet etching process.

Figure 5D:
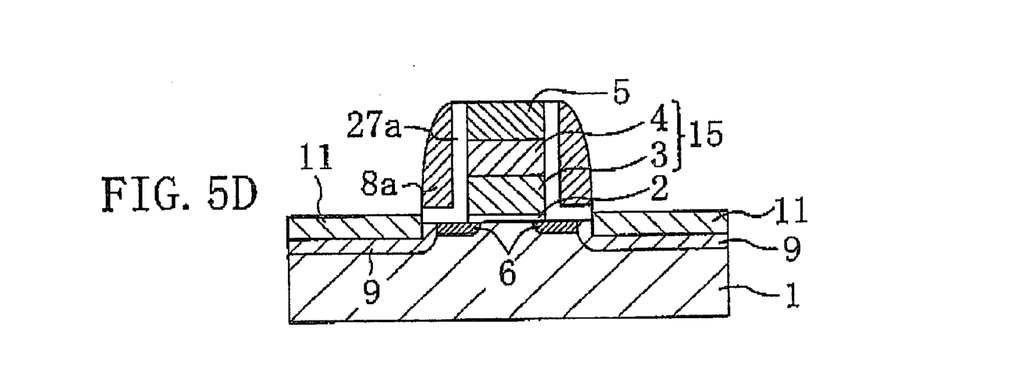

In the semiconductor device and method for fabricating the device in accordance with this embodiment, the L-LTO sidewall 27a on the Si substrate 1 remains unetched by the hydrofluoric acid solution in the process step shown in FIG. 5D. Thus, no oxide-removed regions Rde as shown in FIG. 6D are created, and almost no part of the cobalt silicide layer 11 exists under the stacked sidewall 20E. That is to say, the cobalt silicide layer 11 is formed substantially nowhere but outside of the lower edge of the stacked sidewall 20E. Thus, the cobalt silicide layer 11 does not extend laterally to reach the n-type extended (or LDD) regions 6 having a shallow junction. Accordingly, the bottom of the cobalt silicide layer 11 is surrounded by the heavily doped source/drain regions 9. As a result, the leakage current, which should otherwise flow between the cobalt silicide layer 11 and the substrate region (i.e., the p-well in this case) of the Si substrate 1, can be reduced greatly.

Also, the nitride sidewall 8a is not in contact with the gate electrode 15 or Si substrate 1. Thus, it is possible to suppress the occurrence of interface states in the Si substrate 1 or decrease in hot carrier durability and reliability of the gate insulating film 2 due to the excessive stress applied from the nitride sidewall 8a to the channel region.

In addition, the LTO film 27 is annealed and densified before the silicon nitride film 8 is deposited. Thus, it is possible to suppress the diffusion of the dopant, which has been introduced into the n-type extended (or LDD) regions, into the LTO film 27.

In the method of this embodiment, the LTO film 27 is deposited by the LPCVD process in the process step shown in FIG. 5B. Alternatively, a high temperature oxide (HTO) film may be deposited at a temperature of about 800° C. instead of the LTO film.

The densified LTO (or HTO) film of this embodiment is an alternative to the silicon oxynitride film 17 that is used as a prototype of the L-sidewall 17a for the first embodiment. In the same way, the silicon oxynitride film 17 used as a prototype of the L-sidewall 17a for the third embodiment may also be replaced with a densified LTO (or HTO) film.

Alternative Embodiments

In the foregoing embodiments, the silicide layer is formed on the source/drain regions only. Alternatively, the upper gate electrode may be made of a silicide film, not the metal film. In that case, when parts of the source/drain regions are silicided, the upper part of the polysilicon film to be the lower gate electrode may be silicided with no on-gate passivation film provided. Alternatively, the upper part of the polysilicon film may also be silicided separately from the source/drain regions. Then, the resultant polyside film may be patterned to form a gate electrode made up of upper and lower gate electrodes.

Also, process steps for forming an interconnect layer have not been described or illustrated for the foregoing embodiment. However, according to the present invention, after an interlevel dielectric film has been formed, contacts can be formed to be self-aligned with the gate electrode. That is to say, a so-called "self-aligned contact (SAC) structure" can be made. This is because the on-gate passivation film made of silicon nitride and the nitride sidewall are provided in any of the embodiments.

For the first through fifth embodiments, a MISFET with a so-called "LDD structure", each of which includes extended (or LDD) regions and heavily doped source/drain regions, has been described. However, the present invention is not limited to these embodiments but is applicable to a semiconductor device with a single pair of source/drain regions. This is because if this invention is applied to the single source/drain structure, the silicide layer also exists nowhere but outside of the edge of the sidewall (i.e., does not reach too close to the gate electrode or the channel region) and is surrounded by the source/drain regions.

What is claimed is:

1. A semiconductor device comprising:
a substrate having a semiconductor layer therein;
a gate insulating film formed on the semiconductor layer;
a gate electrode formed on the gate insulating film;
an L-shaped sidewall formed at least over respective sides of the gate electrode;
a nitride sidewall formed on the L-shaped side wall;
source/drain regions formed respectively in the semiconductor layer so as to be arranged on a side of the L-shaped sidewall; and
a silicide layer formed on the source/drain regions,
wherein at least a lower edge of the L-shaped sidewall is made of an oxynitride.

2. The device of claim 1, wherein the L-shaped sidewall is entirely made of the oxynitride film.

3. A semiconductor device comprising:
a substrate having a semiconductor layer therein;
a gate insulating film famed on the semiconductor layer;
a gate electrode formed on the gate insulating film;
an insulator sidewall formed over the sides of the gate electrode
a first nitride sidewall, which has been formed on the sides of the insulator sidewall, a lower edge of the nitride sidewall being in contact with the semiconductor layer;
source/drain regions formed respectively in the semiconductor layer so as to be arranged on a side of the first nitride sidewall; and
a silicide layer formed on the source/drain regions.

4. The device of claim 3, wherein the first nitride sidewall is made of a silicon nitride containing silicon at a mole fraction exceeding a mole fraction defined by stoichiometry.

5. The device of claim 3, wherein the insulator sidewall is made up of an L-shaped oxide sidewall formed on the sides of the gate electrode and a second nitride sidewall formed on the oxide sidewall, the first nitride sidewall being formed on the second nitride sidewall.

6. The device of claim 1, wherein the L-shaped sidewall is made of a silicon dioxide film, and
the oxynitride is formed by nitriding the silicon dioxide film.

7. The device of claim 1, wherein the gate electrode is made up of lower gate electrode of polysilicon film and upper gate electrode of metal film.

8. The device of claim 7, wherein on-gate insulating film is farmed on the upper gate electrode.

9. The device of claim 1, wherein the gate electrode is made up of lower gate electrode of polysilicon film and upper gate electrode of suicide film.

10. The device of claim 1, wherein the suicide layer is formed substantially nowhere but outside of the lower edge of a stacked sidewall which is a stack of the L-shaped sidewall and the nitride sidewall.

11. The device of claim 1, wherein an LDD region is provided in parts of the semiconductor layer below the gate electrode to sandwich the gate electrode therebetween so as to be in contact with an inner side of the source/drain regions.

12. The device of claim 3, wherein the insulator sidewall is an oxide sidewall of silicon dioxide film.

13. The device of claim 4, wherein the insulator sidewall is an oxide sidewall of silicon dioxide film.

14. The device of claim 4, wherein the insulator sidewall consists of an L-shaped oxide sidewall formed over the sides of the gate electrode and second nitride sidewall formed on the oxide sidewall, and
the first nitride sidewall is formed on the second nitride sidewall.

* * * * *